(12) United States Patent
Sakai

(10) Patent No.: US 10,362,701 B2
(45) Date of Patent: Jul. 23, 2019

(54) ELECTRICAL DEVICE, METHOD FOR MANUFACTURING ELECTRICAL DEVICE, AND ELECTRIC COMPRESSOR

(71) Applicant: DENSO CORPORATION, Kariya, Aichi-pref. (JP)

(72) Inventor: Koji Sakai, Kariya (JP)

(73) Assignee: DENSO CORPORATION, Kariya, Aichi-pref. (JP)

( * ) Notice: Subject to any disclaimer, the term of this patent is extended or adjusted under 35 U.S.C. 154(b) by 149 days.

(21) Appl. No.: 15/511,682

(22) PCT Filed: Sep. 24, 2015

(86) PCT No.: PCT/JP2015/004850
§ 371 (c)(1),
(2) Date: Mar. 16, 2017

(87) PCT Pub. No.: WO2016/056194
PCT Pub. Date: Apr. 14, 2016

(65) Prior Publication Data
US 2017/0295662 A1   Oct. 12, 2017

(30) Foreign Application Priority Data

Oct. 9, 2014   (JP) ................. 2014-208282

(51) Int. Cl.
*H02K 11/33*  (2016.01)
*H05K 7/14*   (2006.01)
(Continued)

(52) U.S. Cl.
CPC ........... *H05K 7/1427* (2013.01); *F04B 35/04* (2013.01); *F04B 39/06* (2013.01); *F04B 39/121* (2013.01);
(Continued)

(58) Field of Classification Search
CPC .......... F04B 39/00; F04B 39/06; F04B 39/12; F04B 39/121; F04B 39/14; F04B 35/04;
(Continued)

(56) References Cited

U.S. PATENT DOCUMENTS 5,091,823 A * 2/1992 Kanbara ................. H02M 5/44
174/351
6,599,104 B2 * 7/2003 Saito ..................... F04C 23/008
417/366

(Continued)

FOREIGN PATENT DOCUMENTS

JP   2003222078 A   8/2003
JP   2004032930 A   1/2004
(Continued)

*Primary Examiner* — Tran N Nguyen
(74) *Attorney, Agent, or Firm* — Harness, Dickey & Pierce, P.L.C.

(57) ABSTRACT

An electrical device includes two or more electrical components that configure an electrical circuit, at least one or more mechanical component that supports the two or more electrical components and is fixed to the two or more electrical components, and a position-adjustment structure that adjusts positions of the two or more electrical components relative to the one or more mechanical component with the at least two or more electrical components being united together, before the one or more mechanical component is fixed to the two or more electrical components.

14 Claims, 11 Drawing Sheets

(51) Int. Cl.

| | | |
|---|---|---|
| *F04B 39/06* | (2006.01) | |
| *H02K 15/02* | (2006.01) | |
| *H02K 11/30* | (2016.01) | |
| *F04B 35/04* | (2006.01) | |
| *F04B 39/12* | (2006.01) | |
| *F04B 39/14* | (2006.01) | |
| *H02M 7/00* | (2006.01) | |
| *H05K 7/20* | (2006.01) | |
| *F04D 13/06* | (2006.01) | |
| *F04D 29/043* | (2006.01) | |
| *H02K 5/22* | (2006.01) | |
| *H02M 7/537* | (2006.01) | |
| *H05K 13/00* | (2006.01) | |
| *H02K 9/19* | (2006.01) | |
| *H02K 15/00* | (2006.01) | |
| *H02M 7/5387* | (2007.01) | |

(52) U.S. Cl.
CPC ............. *F04B 39/14* (2013.01); *F04D 13/06* (2013.01); *F04D 29/043* (2013.01); *H02K 5/22* (2013.01); *H02K 9/19* (2013.01); *H02K 11/30* (2016.01); *H02K 11/33* (2016.01); *H02K 15/00* (2013.01); *H02K 15/02* (2013.01); *H02M 7/003* (2013.01); *H02M 7/537* (2013.01); *H05K 7/2039* (2013.01); *H05K 7/20927* (2013.01); *H05K 13/0015* (2013.01); *H02K 2213/09* (2013.01); *H02M 7/53871* (2013.01)

(58) Field of Classification Search
CPC .......... H02K 5/22; H02K 11/00; H02K 11/30; H02K 11/33; H02K 9/19; H02K 15/00; H02K 15/02; H05K 7/14; H05K 7/1427; H05K 7/20; H05K 7/20927; H05K 7/2039; H05K 7/00; H05K 13/0015; H05K 5/00; H05K 5/0021; H05K 5/0065; H02M 7/48; H02M 7/53; H02M 7/537; H02M 7/00; H02M 7/003; F04D 29/043; F04D 13/06; B60L 11/14; B62D 5/00; B62D 5/07; B62D 5/22; B62D 6/00; H01L 25/00; H01L 25/072; H01L 25/162
See application file for complete search history.

(56) References Cited

U.S. PATENT DOCUMENTS

| | | | | |
|---|---|---|---|---|
| 6,875,029 | B2* | 4/2005 | Kawabata | ........... B60R 16/0239 439/76.2 |
| 8,441,160 | B2* | 5/2013 | Watanabe | ............. F04B 39/121 310/51 |
| 8,777,591 | B2* | 7/2014 | Cho | ....... F01C 17/066 417/366 |
| 8,882,479 | B2* | 11/2014 | Asai | ....... F04B 35/04 310/68 R |
| 2003/0143090 | A1 | 7/2003 | Iritani et al. | |
| 2007/0231165 | A1 | 10/2007 | Koide et al. | |
| 2010/0209266 | A1 | 8/2010 | Ikeda et al. | |
| 2015/0023081 | A1 | 1/2015 | Obiraki et al. | |

FOREIGN PATENT DOCUMENTS

| | | |
|---|---|---|
| JP | 2005276705 A | 10/2005 |
| JP | 2007263061 A | 10/2007 |
| JP | 2007295639 A | 11/2007 |
| JP | 2009074517 A | 4/2009 |
| JP | 2012122439 A | 6/2012 |
| JP | 2014225706 A | 12/2014 |

* cited by examiner

SECOND SIDE ←— AXIAL DIRECTION —→ FIRST SIDE

ELECTRICAL DEVICE, METHOD FOR MANUFACTURING ELECTRICAL DEVICE, AND ELECTRIC COMPRESSOR

CROSS REFERENCE TO RELATED APPLICATIONS

This application is a U.S. National Phase Application under 35 U.S.C. 371 of International Application No. PCT/JP2015/004850 filed on Sep. 24, 2015 and published in Japanese as WO 2016/056194 A1 on Apr. 14, 2016. This application is based on and claims the benefit of priority from Japanese Patent Application No. 2014-208282 filed on Oct. 9, 2014. The entire disclosures of all of the above applications are incorporated herein by reference.

TECHNICAL FIELD

The present disclosure relates to an electrical device, a method for manufacturing the electrical device, and an electric compressor.

BACKGROUND ART

In a conventional electric compressor, a compressor section where a compression mechanism is driven by an electric motor is united with an inverter device that controls the electric motor, and the drive circuit of the inverter is cooled by a refrigerant sucked into the compression mechanism (see, for example, Patent Literature 1).

An inverter drive device includes a case formed in a tubular shape and having a bottom, and a lid part that closes the opening of the case to configure a housing. A circuit board that configures a drive circuit is disposed on the bottom side of the case. The circuit board is cooled by a sucked-in refrigerant via the bottom of the case.

Meanwhile, a press-fit connection has been described (for example, see Patent Literature 2), in which a terminal is inserted into a through hole of a circuit board to electrically connect the circuit board and the terminal.

PRIOR ART LITERATURES

Patent Literatures

Patent Literature 1: JP2009-74517A
Patent Literature 2: JP2005-276705A

SUMMARY OF INVENTION

The inventor has investigated reduction of dimensional tolerances (hereinafter, assembly tolerances) of united parts, when, in an inverter drive device, the united parts are configured by a case, an electrical component A, and a circuit board by fixing the electrical component A (e.g., capacitor) to the circuit board as well as to the case, and then by fixing the circuit board to the case.

The press-fit connection is one example of a structure that connects a lead of an electrical component A to the circuit board. In order to insert the lead of the electrical component A into a through hole of the circuit board with the circuit board assembled to the case, it is necessary to achieve a high positional accuracy of the through hole in the circuit board in the state in which the circuit board is assembled to the case.

The press-fit connection is also one example of a structure that connects a terminal of a connector to a circuit board when the connector is disposed on a lid part, for example. When the lid part is combined with a case to configure a housing, in order to insert the terminal of the connector into a through hole of the circuit board, it is necessary to achieve a high positional accuracy of the through hole in the circuit board.

When an electrical component A and a circuit board are each positioned and fixed relative to the case, for example, the electrical component A is positioned relative to the case first, and fixed to the case with screws.

It is then necessary to align a portion (e.g., electrode) corresponding to a lead terminal of the circuit board with the lead terminal of the electrical component A in order to position the circuit board relative to the electrical component A.

Meanwhile, in order to position the circuit board relative to the case, it is necessary to adjust the position of the circuit board such that a reference position of the circuit board matches a positioning mechanism (e.g., positioning pin) provided on the case.

When the assembly tolerances are reduced as mentioned above, it is difficult to achieve both of the positioning of the circuit board relative to the electrical component A and the positioning of the circuit board relative to the case.

Therefore, it is necessary either to increase the assembly tolerances so as to achieve both of the positioning of the circuit board relative to the electrical component A and the positioning of the circuit board relative to the case, or, to bend a lead terminal of the electrical component A and connect the circuit board to the bent lead terminal.

A detailed investigation by the inventor showed that increasing the assembly tolerances would lower the reliability of connection between the circuit board and the lead of the electrical component A, and revealed a problem that a connecting structure that requires high positional accuracy such as a press-fit connection cannot be applied as the connecting structure between a terminal of a connector in a lid part and the circuit board.

Another problem found out by the inventor is that, while it is possible to bend a lead terminal of an electrical component A and to connect the lead terminal to the circuit board, there is a possibility of a failure resulting from the stress the lead terminal may suffer when bent. Yet another problem found out by the inventor is that the production step of bending the lead terminal of the electrical component A and connecting the lead terminal to the circuit board may not be feasible in an automated assembly line that uses automated machines.

While the problems that arise with the use of an electrical component A, a circuit board, and a case have been described above, the same problems would arise with the use of two or more electrical components other than the circuit board and a mechanical component other than the case.

An object of the present disclosure is to provide an electrical device that allows position adjustment of two or more electrical components relative to a mechanical component, a method for manufacturing the electrical device, and an electric compressor.

According to an aspect of the present disclosure, the electrical device includes two or more electrical components that configure an electrical circuit, at least one or more mechanical component that supports the two or more electrical components and is fixed to the two or more electrical components, and a position-adjustment structure that adjusts positions of the two or more electrical components relative to the one or more mechanical component with the at least two or more electrical components being united together, before the one or more mechanical component is fixed to the two or more electrical components.

Thus, the electrical device that allows position adjustment of two or more electrical components relative to a mechanical component can be provided.

BRIEF DESCRIPTION OF DRAWINGS

The above and other objects, features and advantages of the present disclosure will become more apparent from the following detailed description made with reference to the accompanying drawings. In the drawings.

DESCRIPTION OF EMBODIMENTS

Figure 1:
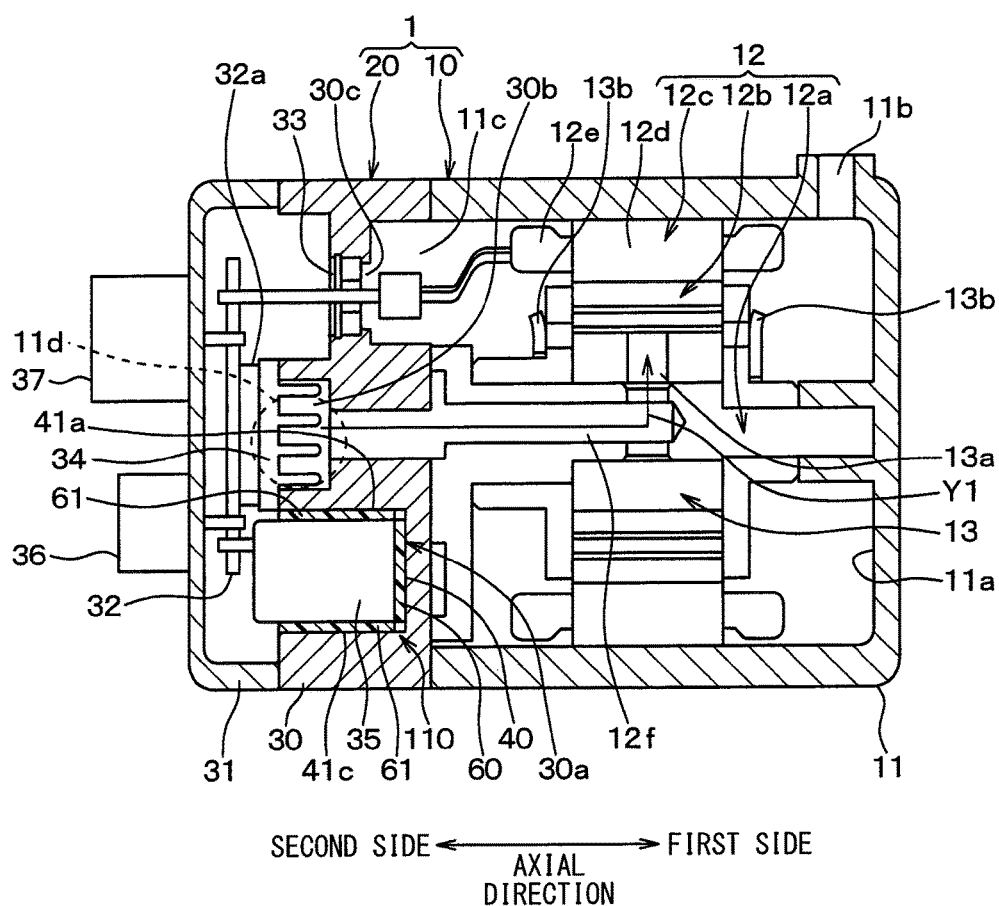
FIG. 1 is a diagram illustrating the cross-sectional configuration of an electric compressor in a first embodiment of the present disclosure.

Hereinafter, embodiments of the present disclosure will be described with reference to the drawings. Elements in the following embodiments that are identical or equivalent to each other are given the same reference numerals in the drawings for simplification of explanation.

First Embodiment

FIG. 1 shows a first embodiment of an in-vehicle electric compressor 1 to which the electrical device according to the present disclosure is applied.

The in-vehicle electric compressor 1 configures a known refrigeration cycle device that circulates a refrigerant with a condenser, a pressure decreasing valve, and an evaporator, and includes a compressor section 10 and an inverter device 20. The compressor section 10 includes a compressor housing 11, an electric motor 12, and an inner rotor 13. The compressor housing 11 is formed in a cylindrical shape and has a refrigerant outlet 11b. A first side in the axial direction of the compressor housing 11 is closed by a bottom part 11a. A second side in the axial direction of the compressor housing 11 has an opening 11c formed therein. In the present embodiment, the inverter device 20 is an electrical device.

The electric motor 12 is housed inside the compressor housing 11. The electric motor 12 is a synchronous AC electric motor and configured by a rotating shaft 12a, a rotor 12b, and a stator 12c.

The rotating shaft 12a is disposed such that the shaft center of the rotating shaft coincides with the axial direction of the compressor housing 11. The rotating shaft 12a is fixed to the compressor housing 11. The rotor 12b is supported to be rotatable relative to the rotating shaft 12a. The rotor 12b is disposed on the radially outer side of the rotating shaft 12a in relation to the shaft center. The stator 12c is disposed on the radially outer side of the rotor 12b. The stator 12c is configured by a stator core 12d and a coil 12e wound around the core, and supported on the inner circumferential surface of the compressor housing 11. The inner rotor 13 is disposed between the rotating shaft 12a and the rotor 12b of the compressor housing 11. The inner rotor 13 is disposed to be rotatable relative to the rotating shaft 12a. The inner rotor 13 is driven to rotate by the rotor 12b via a connection plate (not shown). The inner rotor 13 is provided with a refrigerant flow passage 13a that extends through radially relative to the center axis line of the rotating shaft 12a. The refrigerant flow passage 13a feeds a low pressure refrigerant that is supplied from the evaporator side through a refrigerant inlet 11d and a refrigerant flow passage 12f of the rotating shaft 12a as indicated by arrow Y1 to a compression chamber between the inner rotor 13 and the rotor 12b. The refrigerant flow passage 12f is a refrigerant flow passage formed along the axial direction of the rotating shaft 12a. The inner rotor 13 sucks in the refrigerant into the compression chamber as the inner rotor 13 rotates, compresses the sucked-in refrigerant in the compression chamber, and discharges the refrigerant. The refrigerant inlet 11d is formed in an inverter case 30.

In addition to the inverter case 30, the inverter device 20 includes a lid part 31, a circuit board 32, a hermetic terminal 33, a cooling fin 34, a capacitor 35, and connectors 36 and 37.

The inverter case 30 configures a housing that houses the circuit board 32, the capacitor 35, and others together with the lid part 31. In other words, the inverter case 30 is a mechanical component that supports the circuit board 32, the capacitor 35, and others. The lid part 31 is formed so as to cover the second side in the axial direction of the inverter case 30. The inverter case 30 and the lid part 31 are fitted to each other and secured to the compressor housing 11 with a plurality of screws (not shown).

A recess 30a and through holes 30b and 30c are provided in the inverter case 30. The recess 30a is on the second side in the axial direction of the inverter case 30 to be recessed toward the first side in the axial direction. The through holes 30b and 30c are each formed to extend through the inverter case 30 in the axial direction.

The circuit board 32 is mounted on the second side in the axial direction of the inverter case 30. The circuit board 32 is secured to the compressor housing 11 with a plurality of screws (not shown).

The circuit board 32 is a substrate on which a drive circuit 51 (see FIG. 2) or the like for driving the electric motor 12 is mounted. In other words, the circuit board 32 is an electrical component that configures the drive circuit 51 as an electrical circuit.

The cooling fin 34 is disposed inside the through hole 30b of the compressor housing 11. The cooling fin 34 is disposed on the radially inner side of the refrigerant inlet 11d relative to the center axis line on the first side in the axial direction of a molded part 32a of the circuit board 32. The molded part 32a is a part on one side of the circuit board 32 on a central side in a planar direction that is covered by resin. The cooling fin 34 accelerates heat dissipation from the molded part 32a to the refrigerant.

The capacitor 35 is housed inside the recess 30a of the inverter case 30. A grease 60 is deposited between the capacitor 35 and a bottom part 40 of the inverter case 30 that forms the recess 30a. The grease 60 is used for conducting heat generated from the capacitor 35 to the inverter case 30. The grease 60 is made of silicone or the like in the present embodiment. The bottom part 40 is formed on the first side in the axial direction of the recess 30a.

A potting material 61 is disposed between side faces 41a, 41b, 41c, and 41d (only the side faces 41a and 41c are shown in FIG. 1) that form the recess 30a of the inverter case 30 and the capacitor 35. The potting material 61, when hardened, fixes the capacitor 35 to the inverter case 30, as well as serves the function of conducting heat from the capacitor 35 to the inverter case 30. The potting material 61 is made of silicone or the like in the present embodiment. The side faces 41a, 41b, 41c, and 41d are each formed to intersect with the bottom part 40.

In the present embodiment, the recess 30a, the grease 60, and the potting material 61 configure a position-adjustment structure 110 that adjusts the positions of the capacitor 35 and the circuit board 32.

The connectors 36 and 37 are each mounted to the lid part 31. The connectors 36 and 37 are electrically connected with a high voltage power supply 70 and a low voltage power supply 75, as well as electrically connected with the circuit board 32. In other words, the connectors 36 and 37 relay the electrical connection between the high voltage power supply 70 and the low voltage power supply 75 and the circuit board 32. For the connection structure between the connectors 36 and 37 and the circuit board 32 in the present embodiment, the press-fit connection of Patent Literature 2 is applied. The hermetic terminal 33 is disposed in the opening 11c of the compressor housing 11. The hermetic terminal 33 is a terminal that electrically connects the circuit board 32 inside the inverter device 20 to the electric motor 12.

Figure 2:
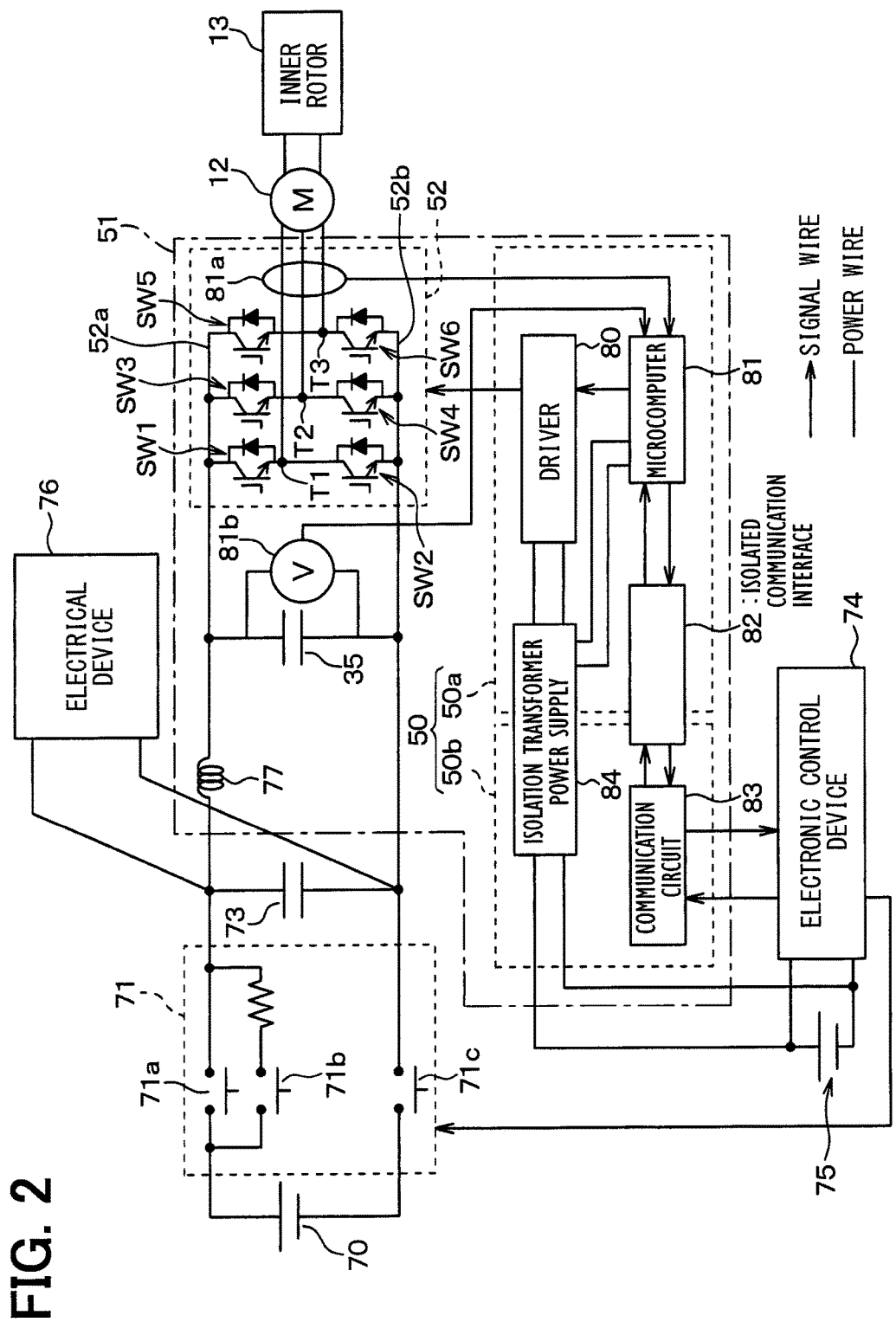
FIG. 2 is an electrical circuit diagram illustrating the electrical circuit configuration of the inverter device in FIG. 1.

Next, the details of the drive circuit 51 of the present embodiment will be described with reference to FIG. 2.

The drive circuit 51 includes switching elements SW1 to SW6, the capacitor 35, a coil (normal coil) 77, and a control circuit 50. The switching elements SW1 to SW6 configure an inverter circuit 52 that outputs a three-phase alternating current to the electric motor 12 and are mounted on the circuit board 32.

The switching elements SW1, SW3, and SW5 are connected with a positive bus bar 52a. The positive bus bar 52a is connected with a positive electrode of the high voltage power supply 70. The switching elements SW2, SW4, and SW6 are connected with a negative bus bar 52b. The negative bus bar 52b is connected with a negative electrode of the high voltage power supply 70. The switching elements SW1 and SW2 are series-connected between the positive bus bar 52a and the negative bus bar 52b. The switching elements SW3 and SW4 are series-connected between the positive bus bar 52a and the negative bus bar 52b. The switching elements SW5 and SW6 are series-connected between the positive bus bar 52a and the negative bus bar 52b.

The switching elements SW1 to SW6 output a three-phase alternating current from common connection terminals T1, T2, and T3 to the coil 12e of the stator core 12d by switching operation. The common connection terminal T1 is a common connection terminal between the switching elements SW1 and SW2. The common connection terminal T2 is a common connection terminal between the switching elements SW3 and SW4. The common connection terminal T3 is a common connection terminal between the switching elements SW5 and SW6. The switching elements SW1, SW2, SW3, SW4, SW5, and SW6 are each configured by one of various semiconductor switching elements such as an IGBT (Insulated Gate Bipolar Transistor) and a freewheeling diode.

The capacitor 35 configures a filter circuit that stabilize the voltage (of, e.g., 280V) applied from the high voltage power supply 70 to between the positive bus bar 52a and the negative bus bar 52b, together with the coil 77. In other words, the coil 77 is an electrical component that configures the drive circuit 51 as an electrical circuit. Optionally, a common coil (not shown) may be provided between the capacitors 35 and 73.

The control circuit 50 controls the switching elements SW1 to SW6 based on commands from an electronic control device 74.

More specifically, the control circuit 50 includes a driver 80, a microcomputer 81, an isolated communication interface 82, a communication circuit 83, and an isolation transformer power supply 84. The driver 80 is controlled by the microcomputer 81 to control the switching elements SW1 to SW6.

The microcomputer 81 controls the driver 80 based on command values input from the electronic control device 74 via the isolated communication interface 82 and the communication circuit 83, detected values of a current sensor 81a, and detected values of a voltage sensor 81b. A current sensor 51a detects the three-phase alternating current output from the common connection terminals T1, T2, and T3 to the stator core 12d and outputs the detected value to the microcomputer 81. A voltage sensor 51b detects the voltage across terminals of the capacitor 35 and outputs the detected value to the microcomputer 81. The isolated communication interface 82 is a communication circuit for communication between the communication circuit 83 and the microcomputer 81 in an electrically insulated manner. A photo coupler or a semiconductor isolator, for example, is used for the isolated communication interface 82. The communication circuit 83 provides communication between the electronic control device 74 and the microcomputer 81. A communication system such as a serial communication, LIN communication, CAN communication, and the like is used for the communication circuit 83. The isolation transformer power supply 84 supplies power for the power sources of the driver 80 and the microcomputer 81 based on the power supply voltage (of, e.g., 12V) output from the low voltage power supply 75 with the electric isolated between a high voltage control circuit 50a and a low voltage control circuit 50b. For the isolation transformer power supply 84, a voltage converter circuit of a transformer type is used, for example. The high voltage control circuit 50a includes the driver 80 and the microcomputer 81. The low voltage control circuit 50b includes the communication circuit 83.

The electronic control device 74 outputs command values indicative of target rpm of the electric motor 12 to the microcomputer 81, and controls a high voltage relay system 71. The high voltage relay system 71 includes the capacitors 35 and 73, the coil 77, and relay switches 71a, 71b, and 71c that open and close between the inverter circuit 52 and the high voltage power supply 70. The high voltage relay system 71 serves as the function of preventing an inrush current from the high voltage power supply 70 from flowing to the capacitors 35 and 73.

The capacitor 73 stabilizes the high voltage output from the high voltage power supply 70 to the electrical device 76. The high voltage power supply 70 is a drive circuit of a vehicle drive motor, a voltage drop DC/DC converter, a high voltage heater, and the like.

The high voltage power supply 70, the high voltage relay system 71, the capacitor 73, the electronic control device 74, the low voltage power supply 75, and the electrical device 76 are disposed in other parts of the car than the in-vehicle electric compressor 1.

Next, the operation of the in-vehicle electric compressor 1 of the present embodiment will be described.

The control circuit 50 controls the switching operation of the switching elements SW1 to SW6. With the switching operation of the switching elements SW1 to SW6, a three-phase alternating current is output from the common connection terminals T1, T2, and T3 to the coil 12e of the stator core 12d based on the output voltage of the capacitor 35. A rotating magnetic field is then generated from the coil 12e of the stator core 12d. Then, the rotor 12b rotates in synchronization with the rotating magnetic field. The inner rotor 13 then starts rotating with the rotation of the rotor 12b, and thus the inner rotor 13 performs the compression operation.

In other words, a low pressure refrigerant supplied from the evaporator side via the refrigerant inlet 11d, the refrigerant flow passage 12f of the rotating shaft 12a, and the refrigerant flow passage 13a in the inner rotor 13, as indicated by arrow Y1, is fed to the compression chamber. The low pressure refrigerant supplied from the refrigerant inlet 11d toward the through hole 30b cools the cooling fin 34. The inner rotor 13 rotates and thereby compresses the refrigerant in the compression chamber. The compressed high pressure refrigerant is discharged from the compression chamber into the compressor housing 11 when two discharge valves 13b are opened. The discharged high pressure refrigerant is discharged from the refrigerant outlet 11b toward the condenser.

At this time, the capacitor 35 and the coil 77 each generate heat. For example, the heat generated from the capacitor 35 is dissipated to the inverter case 30 through the potting material 61, and the side faces 41a, 41b, 41c, and 41d of the recess 30a. The heat generated from the capacitor 35 is dissipated to the inverter case 30 through the grease 60, and the bottom part 40 of the recess 30a.

Figure 3:
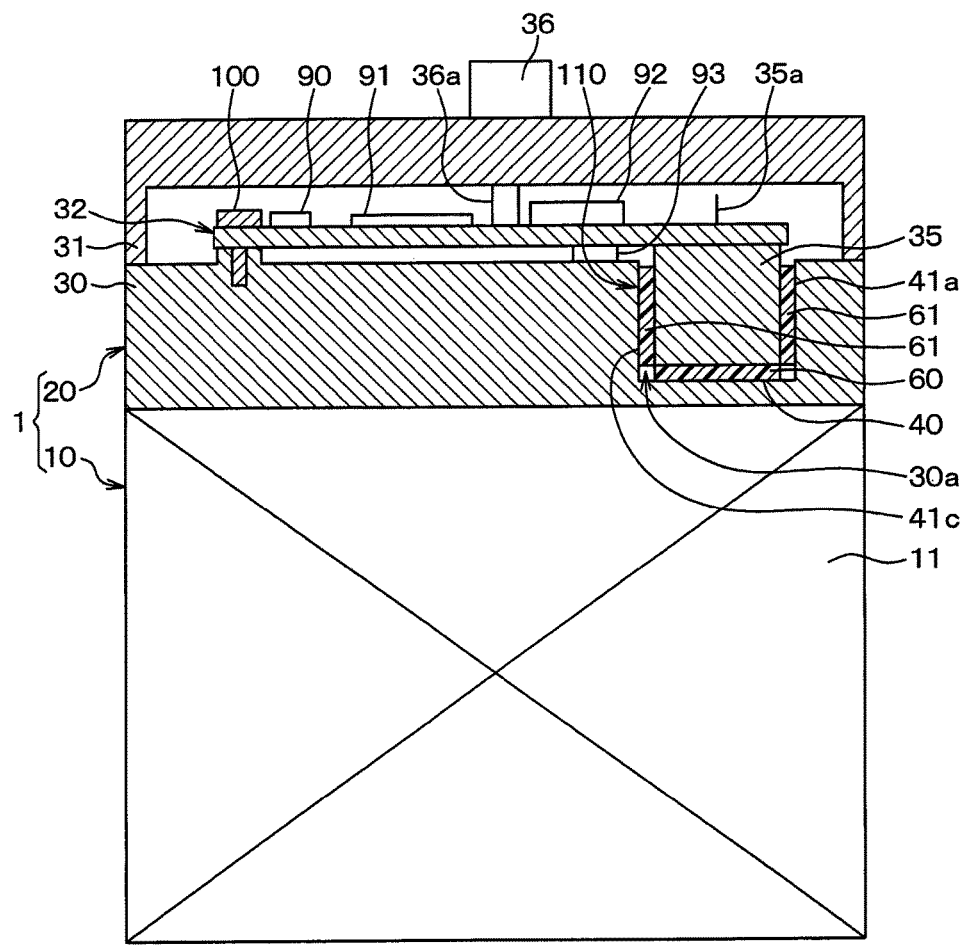
FIG. 3 is a schematic diagram illustrating main constituent elements of the electric compressor of FIG. 1.
Figure 4:
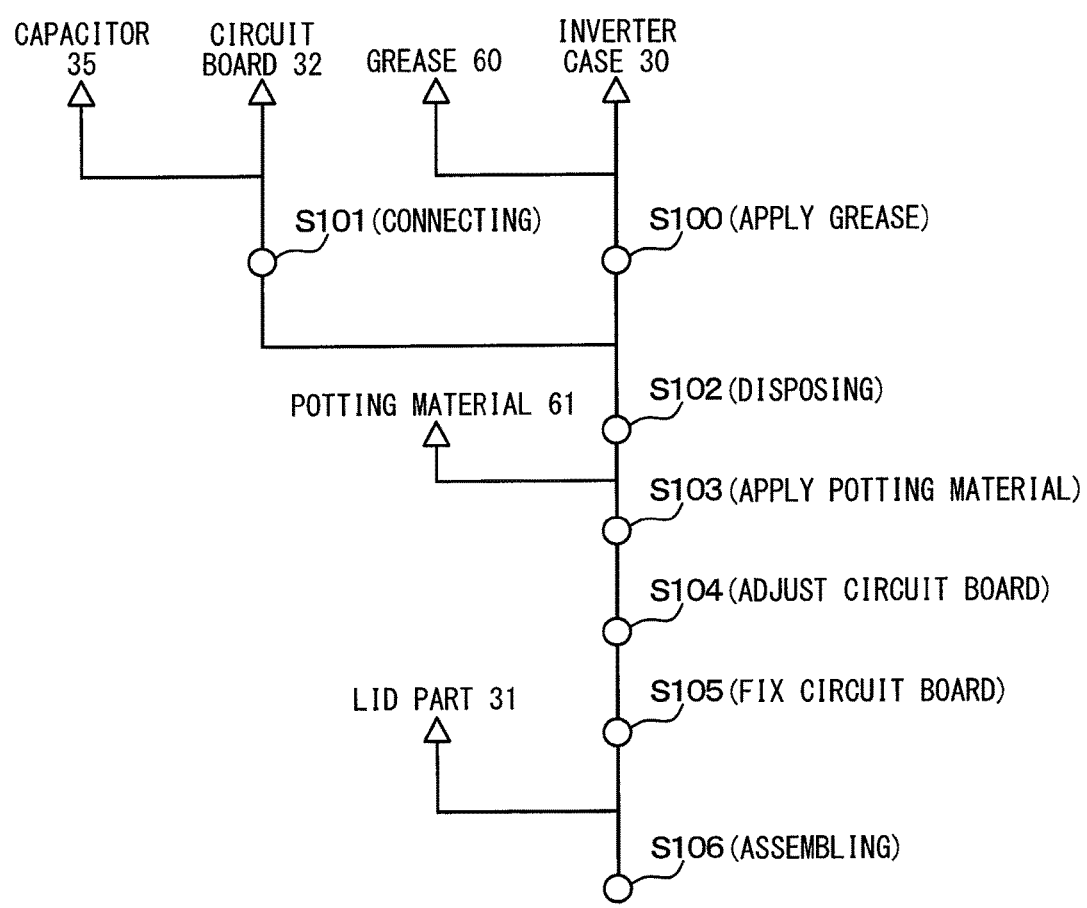
FIG. 4 is a flowchart illustrating a method for manufacturing the electric compressor of FIG. 3.

Next, a method for manufacturing the inverter device 20 of the present embodiment will be described with reference to FIG. 3 and FIG. 4. FIG. 3 illustrates main constituent components of the inverter device 20 of the present embodiment. The inverter device 20 of the present embodiment includes the inverter case 30, the lid part 31, the circuit board 32, the capacitor 35, and a connector 36. Electronic components 90, 91, 92, and 93 that configure the drive circuit 51 and the like are mounted on the circuit board 32. FIG. 4 is a flowchart illustrating the method for manufacturing the inverter device 20.

First, in the first step (S100), with the inverter case 30 disposed on the compressor housing 11, the grease 60 is applied, as a deformable first deformation member, on the bottom part 40 of the recess 30a of the inverter case 30 from the second side in the axial direction (from above in FIG. 3).

In the next step (S101), a lead terminal (electrical connection terminal) 35a of the capacitor 35 is electrically connected with the circuit board 32. Thus, a sub assembly of the capacitor 35 and the circuit board 32 united in one piece (united electrical component) is obtained. The press-fit connection is used as one example of the structure for connecting the lead terminal 35a of the capacitor 35 to the circuit board 32.

In the next step (S102), the sub assembly is mounted to the inverter case 30 from the second side in the axial direction (from above in FIG. 3). More specifically, with the capacitor 35 set in the recess 30a, the capacitor 35 and the circuit board 32 are mounted to the inverter case 30. This way, the capacitor 35 and the circuit board 32 are supported by the inverter case 30. Therefore, the circuit board 32 is disposed to cover the capacitor 35 from the second side in the axial direction (from above in FIG. 3).

In the next step (S103), the potting material 61 before the hardening is applied as a deformable second deformation member from the second side in the axial direction (from above in FIG. 3) to between the side faces 41a, 41b, 41c, and 41d that form the recess 30a of the inverter case 30 and the capacitor 35. The position-adjustment structure 110 is thus configured, and the capacitor 35 and the inverter case 30 are not in contact with each other because of the potting material 61 and the grease 60.

In the next step (S104), the position of the circuit board 32 is adjusted with the use of the lid part 31 and a jig before the potting material 61 hardens. More specifically, the position of the capacitor 35 inside the recess 30a is adjusted by deforming the potting material 61 and the grease 60. With this, the position of the through hole in the circuit board 32 is adjusted.

In the next step (S105), the circuit board 32 is fixed to the inverter case 30 with the use of screws 100.

In the next step (S106), the lid part 31 is fitted to the inverter case 30 from the second side in the axial direction (from above in FIG. 3). At this time, a terminal 36a of the connector 36 is inserted into the through hole of the circuit board 32. Accordingly, the terminal 36a of the connector 36 is electrically connected with the circuit board 32. After that, the lid part 31 and the inverter case 30 are fixed to the compressor housing 11 with a plurality of screws. Thus, the inverter device 20 is assembled.

According to the present embodiment described above, the circuit board 32 and the capacitor 35 are electrically connected with each other and fixed to the inverter case 30 in the inverter device 20. The circuit board 32 and the capacitor 35 are electrically connected with each other before the circuit board 32 and the capacitor 35 are fixed to the inverter case 30, and the device includes the position-adjustment structure 110 that adjusts the positions of the circuit board 32 and the capacitor 35 relative to the inverter case 30, with the circuit board 32 and the capacitor 35 being united.

The position-adjustment structure 110 is configured by the recess 30a in the inverter case 30, the grease 60 disposed between the bottom part 40 of the recess 30a and the capacitor 35, and the potting material 61 disposed between the side faces 41a to 41d and the capacitor 35. The grease 60 conducts heat from the capacitor 35 to the inverter case 30. The potting material 61, when hardened, serves as the function of fixing the capacitor 35 to the inverter case 30.

The position of the capacitor 35 inside the recess 30a is adjusted by deforming the potting material 61 before the hardening and the grease 60. With this, the position of the through hole in the circuit board 32 can be adjusted. Therefore, the terminal of the connector 36 can be inserted into the through hole of the circuit board 32 when the lid part 31 is fitted to the inverter case 30. Accordingly, the connector 36 can be reliably and electrically connected with the circuit board 32.

In order to adjust the positions of the circuit board 32 and the capacitor 35 relative to the inverter case 30 without using the position-adjustment structure 110, a holder may be interposed between the inverter case 30 and the circuit board 32, and another holder may be interposed between the inverter case 30 and the capacitor 35. In this case, while the two holders (mechanical components) allow the positions of the circuit board 32 and the capacitor 35 to be adjusted relative to the inverter case 30, the inverter device 20 may become bulkier because the inverter device 20 needs the two holders.

In contrast, in the present embodiment, the position-adjustment structure 110 configured by the recess 30a, the grease 60, and the potting material 61 allows for position adjustment of the circuit board 32 and the capacitor 35 relative to the inverter case 30. Therefore, the inverter device 20 can be made small.

In the present embodiment, the direction in which the grease 60 is applied on the bottom part 40 of the recess 30a of the inverter case 30, the direction in which the sub assembly of the capacitor 35 and the circuit board 32 joined together is mounted to the inverter case 30, the direction in which the potting material 61 before the hardening is applied between the side faces 41a, 41b, 41c, and 41d that form the recess 30a and the capacitor 35, and the direction in which the lid part 31 is fitted to the inverter case 30 are all the same (from the second side in the axial direction). Thus, the production of the inverter device 20 can be performed with ease.

According to investigations by the inventor, the dimensional tolerances (hereinafter, assembly tolerances) of an united member including inverter case 30, the circuit board 32, and the capacitor 35 are ±0.3 mm to ±0.5 mm, and the dimensional tolerances of the circuit board 32 and the capacitor 35 are also ±0.3 mm to ±0.5 mm. Component tolerances can be reduced to some extent by precise processing, but only to a limited extent, and precise processing involves an increase in the production cost. According to the present embodiment, no precise processing is required for configuring the position-adjustment structure 110. Thus, the production cost can be minimized.

Second Embodiment

While one example is described in the first embodiment in which the capacitor 35 and the circuit board 32 are directly connected with each other, another example will be described in the second embodiment in which the capacitor 35 and the circuit board 32 are connected with each other via a bus bar.

Figure 5:
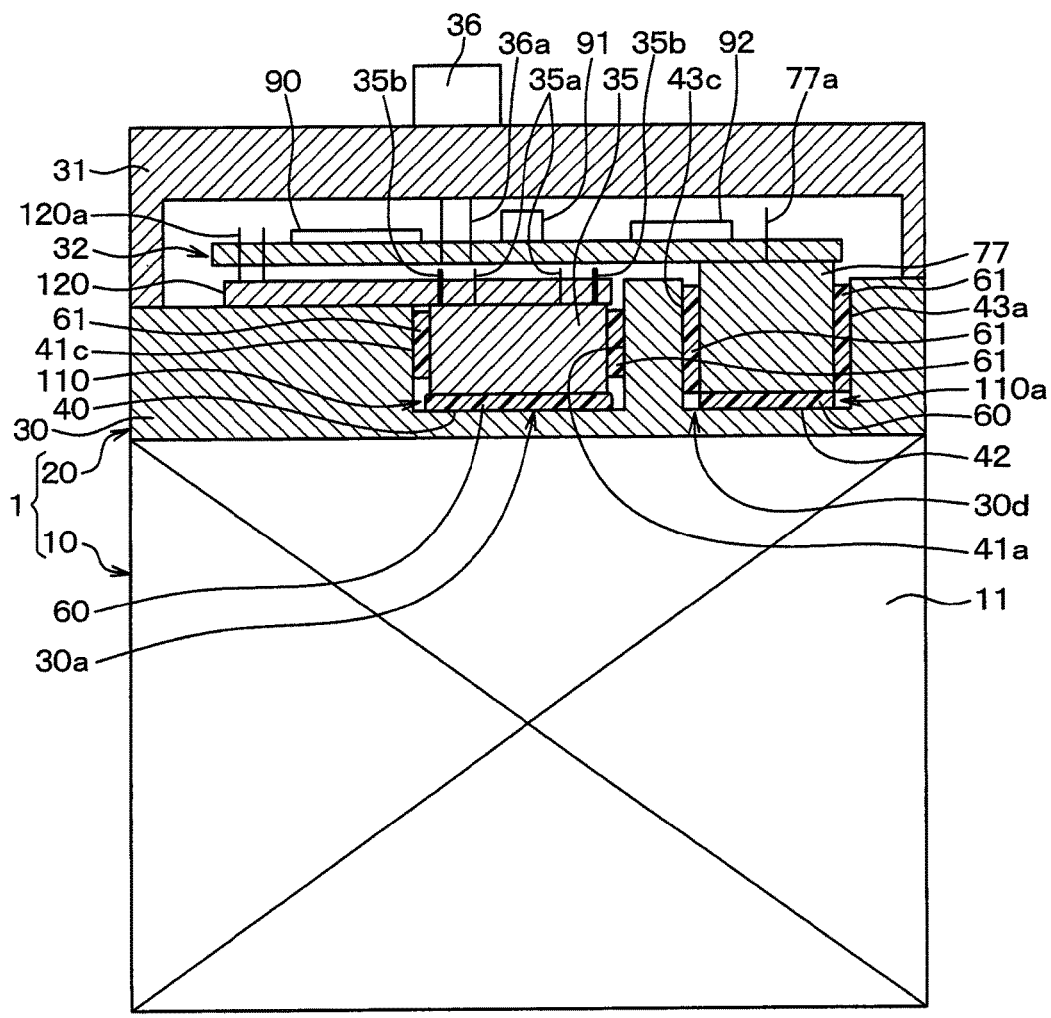
FIG. 5 is a schematic diagram illustrating main constituent elements of an electric compressor in a second embodiment of the present disclosure.

FIG. 5 illustrates main constituent components of the inverter device 20 of the present embodiment. Reference numerals in FIG. 5 that are the same as those of FIG. 3 denote the same elements.

The inverter device 20 of the present embodiment additionally includes the coil 77 and a bus bar 120 (intermediate member) as compared to the inverter device 20 of FIG. 3. The bus bar 120 is an electrical component having an electrical wire and formed from resin or metal in a bar-like or plate-like shape. The electrical wire of the bus bar 120 in the present embodiment serves as the function of electrically connecting the capacitor 35 and the circuit board 32. In other words, the bus bar 120 is an electrical component that configures the drive circuit 51 as an electrical circuit. The bus bar 120 is disposed to overlap the circuit board 32 when viewed in the axial direction.

A press-fit connection is applied as the connection structure between the bus bar 120 and the circuit board 32 in the present embodiment, in which a terminal 120a of the bus bar 120 is inserted into a through hole of the circuit board 32 to connect the bus bar 120 and the circuit board 32. The coil 77 includes the terminal 120a. The terminal 120a is connected with the circuit board 32. For the connection structure between the coil 77 and the circuit board 32, the press-fit connection is applied.

The coil 77 is housed inside the recess 30d of the inverter case 30. The grease 60 is disposed between the coil 77 and a bottom part 42 of the inverter case 30 that forms the recess 30d. The bottom part 42 is formed on the first side in the axial direction of the recess 30d. The potting material 61 is disposed between side faces 43a, 43b, 43c, 43d that form the recess 30d of the inverter case 30 (of which only the side faces 43a, 43c are shown in FIG. 5) and the coil 77. The potting material 61, when hardened, fixes the coil 77 to the inverter case 30, and is also used to conduct heat from the coil 77 to the inverter case 30. The side faces 43a, 43b, 43c, and 43d are each formed to intersect with the bottom part 42. The recess 30d, the grease 60, and the potting material 61 configure a position-adjustment structure 110a that adjusts the positions of the coil 77 and the bus bar 120.

In the present embodiment, the lead terminal 35a (electrical connection terminal) electrically connects the capacitor 35 and the electrical wire of the bus bar 120. In addition, the capacitor 35 and the bus bar 120 are mechanically connected with a plurality of terminals (fixing member) 35b. The plurality of terminals 35b fixes the bus bar 120 and the capacitor 35 at a constant distance. The terminals thereby serve as the function of preventing the lead terminal 35a from being subjected to stress from the bus bar 120 or the capacitor 35 when the bus bar 120 or the capacitor 35 vibrates.

Figure 6:
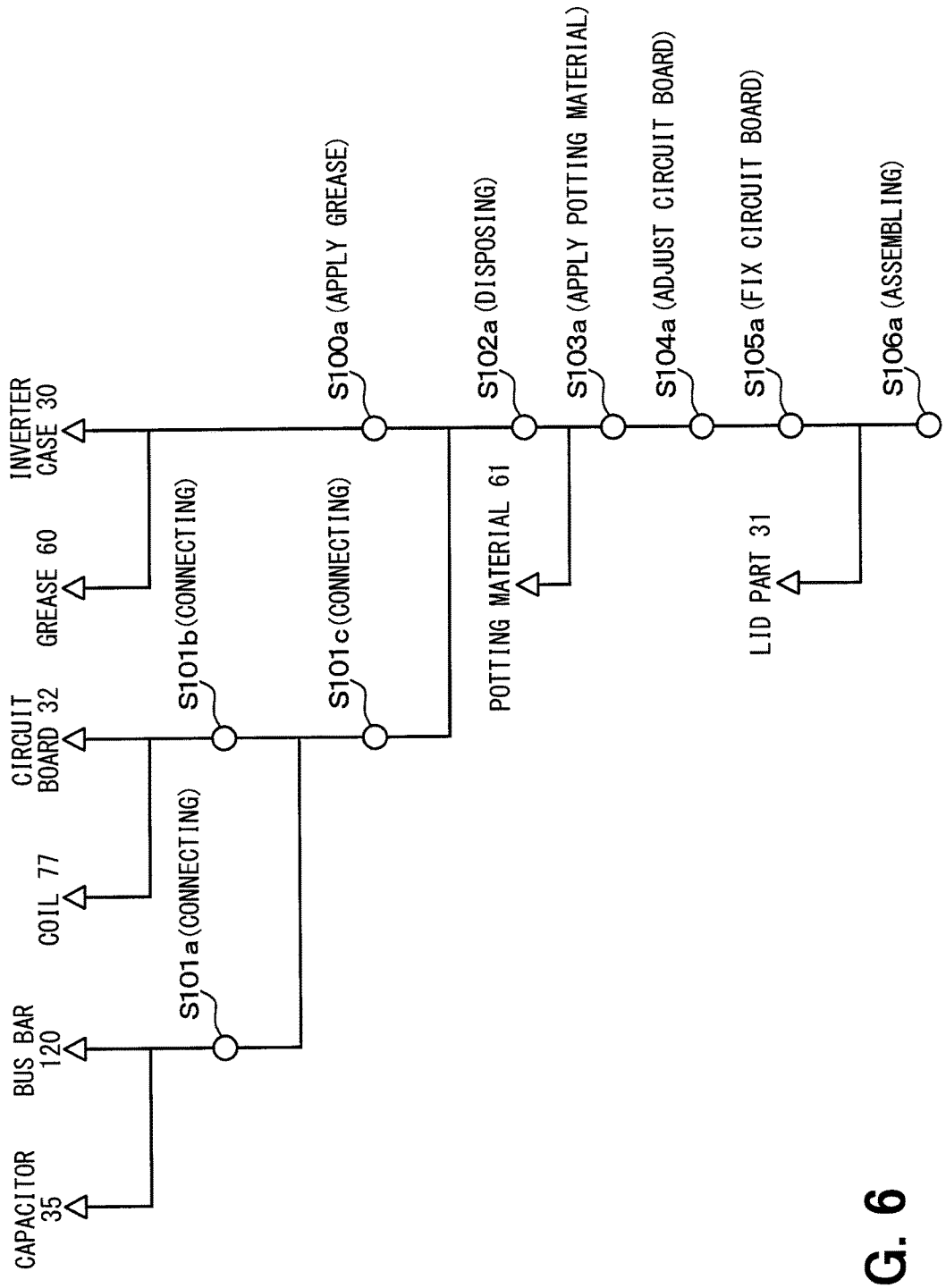
FIG. 6 is a flowchart illustrating a method for manufacturing the electric compressor of FIG. 5.

Next, a method for manufacturing the inverter device 20 of the present embodiment will be described with reference to FIG. 6. FIG. 6 is a flowchart illustrating the method for manufacturing the inverter device 20.

First, in the first step (S100a), with the inverter case 30 disposed on the compressor housing 11, the grease 60 is applied, as a deformable first deformation member, on the bottom part 40 of the recess 30a of the inverter case 30 from the second side in the axial direction (from above in FIG. 5). Further, the grease 60 is applied, as a deformable first deformation member, on the bottom part 42 of the recess 30d of the inverter case 30 from the second side in the axial direction (from above in FIG. 5).

In the next step (S101a), the lead terminal 35a of the capacitor 35 is electrically connected with an electrical wire of the bus bar 120. Here, the capacitor 35 and the bus bar 120 are mechanically connected with a plurality of terminals 35b. In this way, the capacitor 35 and the bus bar 120 are fixed at a constant distance with the plurality of terminals 35b.

In the next step (S101b), a lead terminal 60a of the coil 77 is electrically connected with the circuit board 32.

In the next step (S101c), the terminal 120a of the bus bar 120 is electrically connected with the circuit board 32. Accordingly, the electrical wire of the bus bar 120 is electrically connected with the circuit board 32 via the terminal 120a. Thus, a sub assembly of the capacitor 35, the bus bar 120, the coil 77, and the circuit board 32 united in one piece (united electrical component) is obtained.

In the next step (S102a), the sub assembly is mounted to the inverter case 30 from the second side in the axial direction (from above in FIG. 5). More specifically, with the capacitor 35 set in the recess 30a, and with the coil 77 set in the recess 30d, the capacitor 35, the coil 77, the circuit board 32, and the bus bar 120 are mounted to the inverter case 30. In other words, the capacitor 35, the coil 77, the circuit board 32, and the bus bar 120 are supported by the inverter case 30. This way, the circuit board 32 is disposed to cover the capacitor 35 and the coil 77 from the second side in the axial direction.

In the next step (S103a), the potting material 61 before the hardening is applied as a deformable second deformation member from the second side in the axial direction (from above in FIG. 5) to between the side faces 41a, 41b, 41c, and 41d that form the recess 30a of the inverter case 30 and the capacitor 35. The position-adjustment structure 110 is thus configured, and the capacitor 35 and the inverter case 30 are not in contact with each other because of the potting material 61 and the grease 60.

In addition, the potting material 61 before the hardening is applied as a deformable second deformation member from the second side in the axial direction (from above in FIG. 5) to between the side faces 43a, 43b, 43c, and 43d that form the recess 30d of the inverter case 30 and the coil 77. The position-adjustment structure 110a is thus configured, and the coil 77 and the inverter case 30 are not in contact with each other because of the potting material 61 and the grease 60.

In the next step (S104a), the position of the circuit board 32 is adjusted with the use of the lid part 31 and a jig before the potting material 61 hardens. More specifically, the position of the capacitor 35 inside the recess 30a and the position of the coil 77 inside the recess 30d are adjusted by deforming the potting material 61 and the grease 60. With this configuration, the position of the through hole in the circuit board 32 is adjusted.

In the next step (S105a), the circuit board 32 is fixed to the inverter case 30 with the use of screws (not shown).

In the next step (S106a), the lid part 31 is fitted to the inverter case 30 from the second side in the axial direction (from above in FIG. 5). At this time, the terminal of the connector 36 is inserted into the through hole of the circuit board 32. Accordingly, the connector 36 is electrically connected with the circuit board 32. After that, the lid part 31 and the inverter case 30 are fixed to the compressor housing 11 with a plurality of screws. Thus, the inverter device 20 is assembled.

According to the present embodiment described above, the circuit board 32, the bus bar 120, the coil 77, and the capacitor 35 are electrically connected with each other before the circuit board 32, the bus bar 120, the coil 77, and the capacitor 35 are fixed to the inverter case 30, and the inverter device 20 includes position-adjustment structures 110 and 110a that adjusts the position of the circuit board 32 relative to the inverter case 30, with the circuit board 32, the bus bar 120, the coil 77, and the capacitor 35 being united.

Thus, the positions of the capacitor 35 and the coil 77 inside the recesses 30a and 30d are adjusted by deforming the potting material 61 and the grease 60. With this, the position of the through hole in the circuit board 32 can be correctly adjusted. Therefore, the terminal 36a of the connector 36 can be inserted correctly into the through hole of the circuit board 32 when the lid part 31 is fitted to the inverter case 30. As a result, favorable electrical connection between the terminal 36a of the connector 36 and the circuit board 32 can be achieved In the present embodiment, similarly to the first embodiment described above, the positions of the circuit board 32, the bus bar 120, the coil 77, and the capacitor 35 are adjusted relative to the inverter case 30 without using holders by using the position-adjustment structures 110 and 110a configured by the recesses 30a and 30d, the potting material 61, and the grease 60. Therefore, the inverter device 20 can be made small.

The capacitor 35 and the bus bar 120 in the present embodiment are mechanically connected with a plurality of terminals 35b. Therefore, stress application on the lead terminal 35a from the bus bar 120 or the capacitor 35 can be minimized when the bus bar 120 or the capacitor 35 vibrates. Therefore, it is possible to prevent failures in the lead terminal 35a or solder that connects the capacitor 35 and the bus bar 120.

Third Embodiment

While one example is described in the second embodiment in which the bus bar 120 is disposed to overlap the circuit board 32 when viewed from the second side in the axial direction, another example will be described in the third embodiment in which the bus bar 120 is offset from the circuit board 32 when viewed from the second side in the axial direction.

Figure 7:
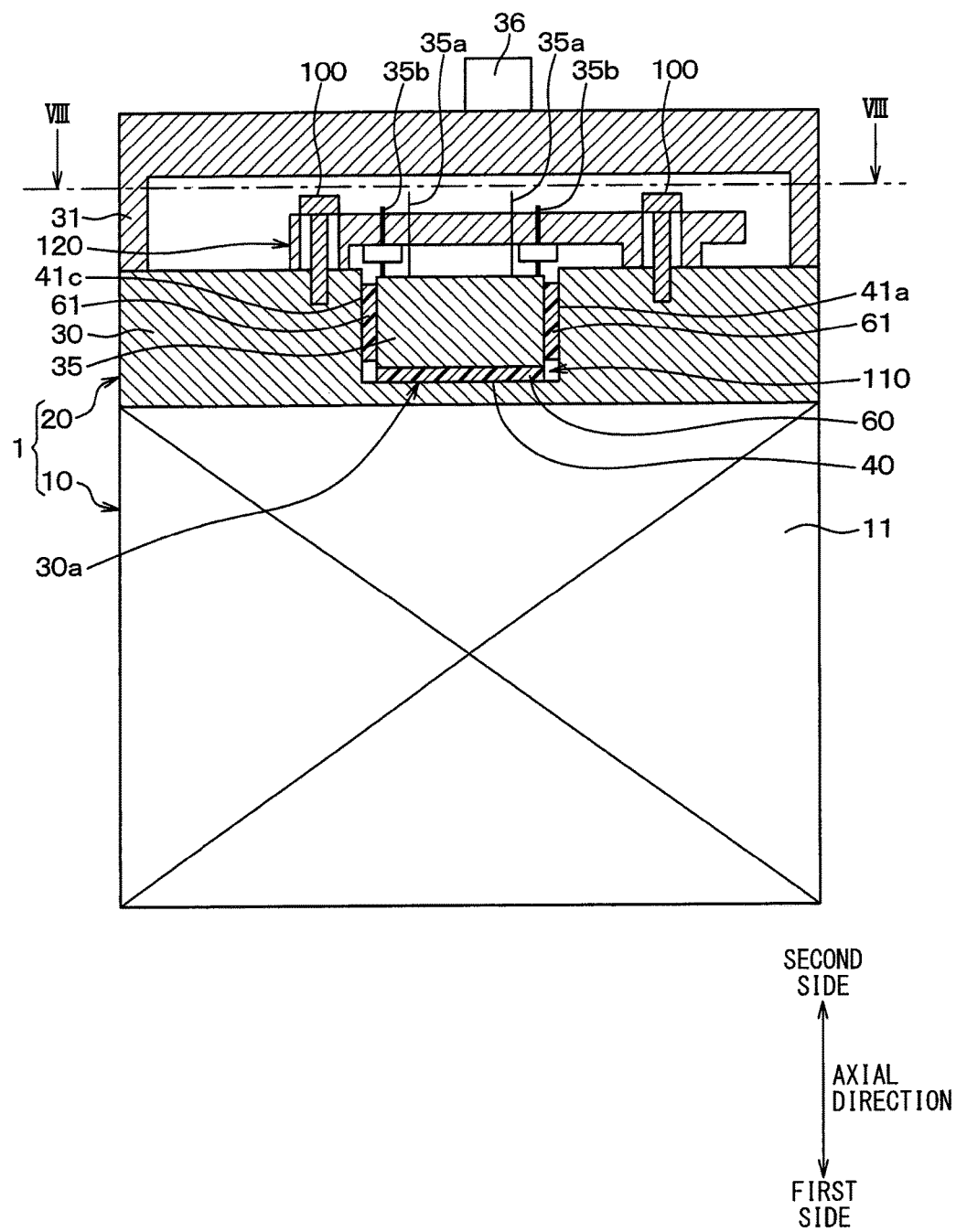
FIG. 7 is a schematic diagram illustrating main constituent elements of an electric compressor in a third embodiment of the present disclosure.
Figure 8:
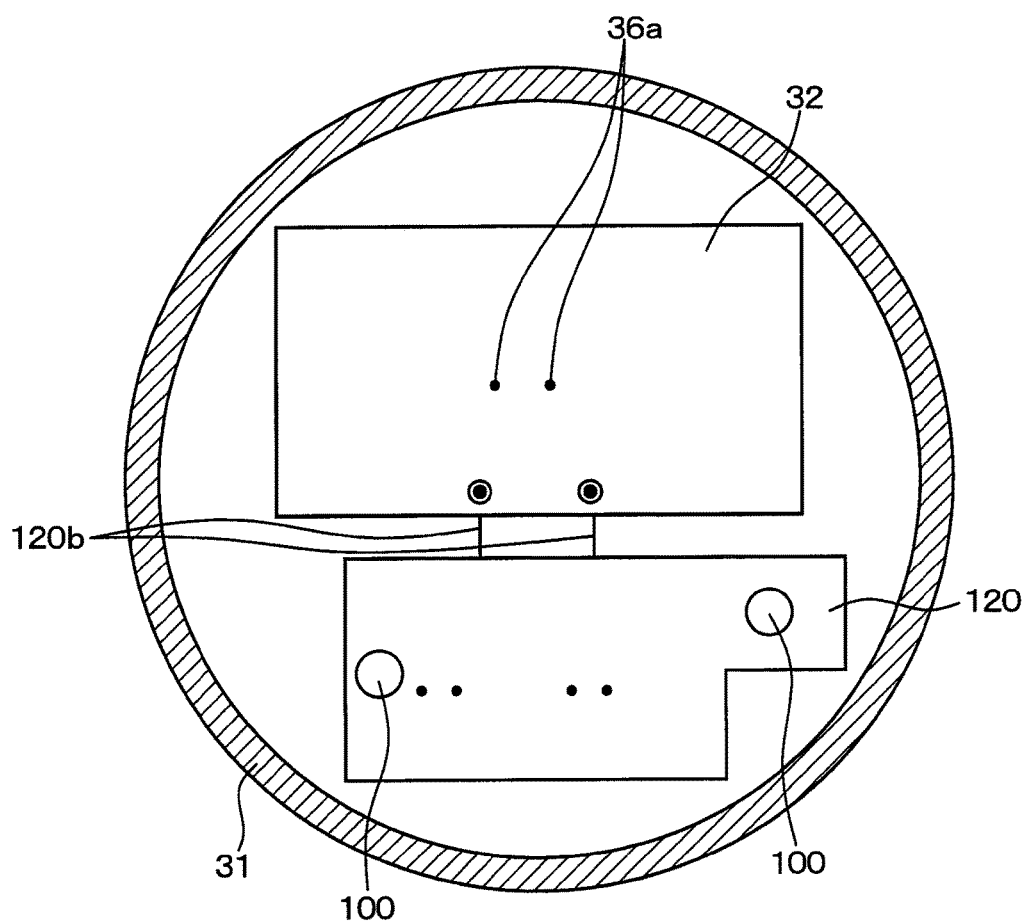
FIG. 8 is a cross-sectional view taken along VIII-VIII in FIG. 7.

FIG. 7 illustrates main constituent components of the inverter device 20 of the present embodiment. FIG. 8 is a cross-sectional view taken along VIII-VIII in FIG. 7. Reference numerals in FIG. 7 and FIG. 8 that are the same as those of FIG. 5 denote the same elements. The bus bar 120 in the present embodiment is disposed to be offset from the circuit board 32 when viewed in the axial direction. In the present embodiment, the coil 77 is not used.

Figure 9:
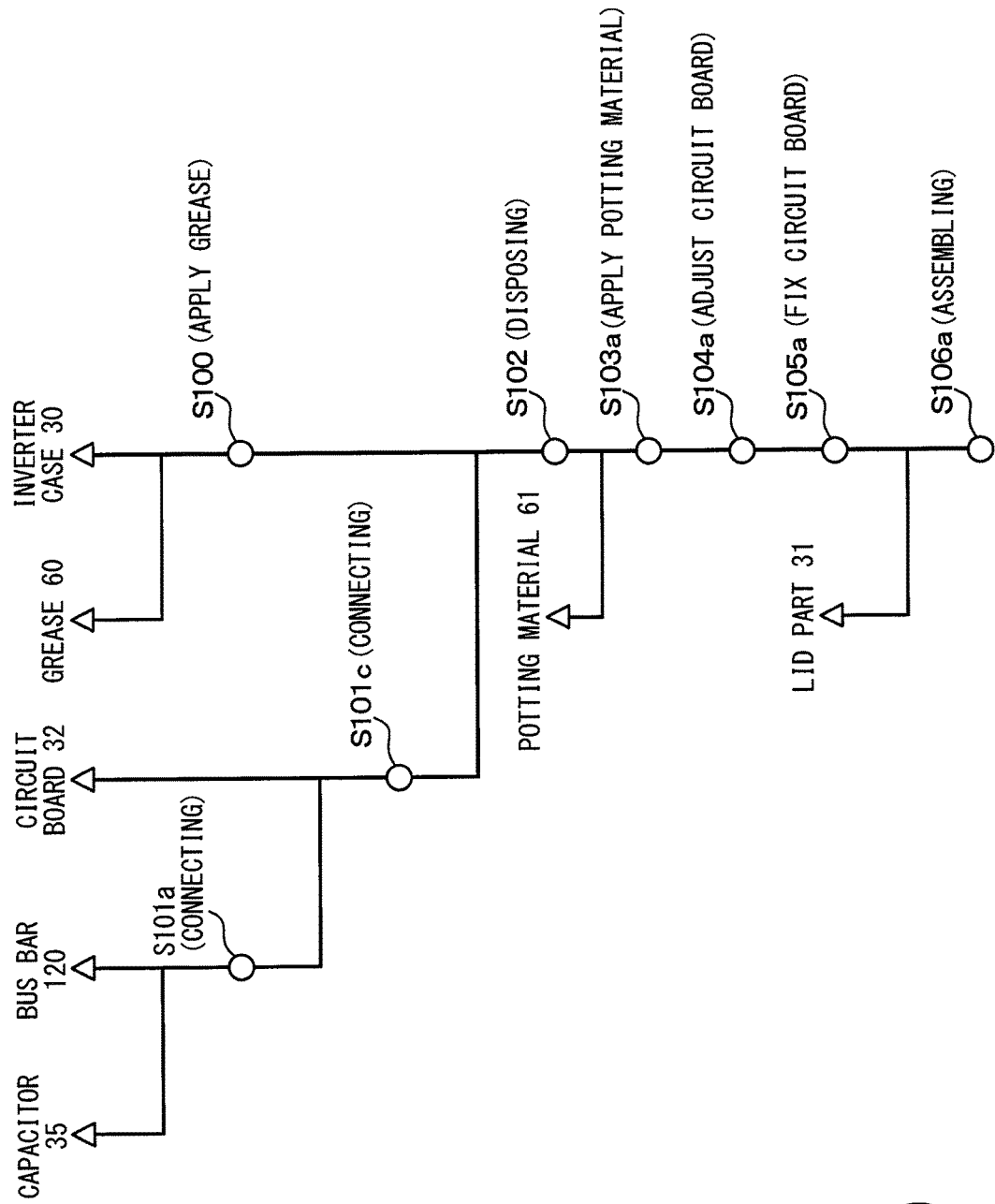
FIG. 9 is a flowchart illustrating a method for manufacturing the electric compressor of FIG. 7 and FIG. 8.

Next, a method for manufacturing the inverter device 20 of the present embodiment will be described with reference to FIG. 9. FIG. 9 is a flowchart illustrating the method for manufacturing the inverter device 20.

First, in the first step (S100), with the inverter case 30 disposed on the compressor housing 11, the grease 60 is applied, as a deformable first deformation member, on the bottom part 40 of the recess 30a of the inverter case 30 from the second side in the axial direction (from above in FIG. 7).

In the next step (S101a), the lead terminal 35a of the capacitor 35 is electrically connected with an electrical wire of the bus bar. Here, a plurality of terminals 35b of the capacitor 35 is mechanically connected with the bus bar 120. This way, the capacitor 35 and the bus bar 120 are fixed at a constant distance with the plurality of terminals 35b.

In the next step (S101c), a terminal 120b of the bus bar 120 is electrically connected with the circuit board 32. Accordingly, the electrical wire of the bus bar 120 is electrically connected with the circuit board 32 via the terminal 120b. Thus, a sub assembly of the capacitor 35, the bus bar 120, and the circuit board 32 united in one piece (united electrical component) is obtained.

In the next step (S102), the sub assembly is mounted to the inverter case 30 from the second side in the axial direction (from above in FIG. 7). More specifically, with the capacitor 35 set in the recess 30a, the capacitor 35, the circuit board 32, and the bus bar 120 are mounted to the inverter case 30. Accordingly, the capacitor 35, the circuit board 32, and the bus bar 120 are supported by the inverter case 30.

In the next step (S103a), the potting material 61 before the hardening is applied as a deformable second deformation member from the second side in the axial direction (from above in FIG. 7) to between the side faces 41a, 41b, 41c, and 41d that form the recess 30a of the inverter case 30 and the capacitor 35. The position-adjustment structure 110 is thus configured, and the capacitor 35 and the inverter case 30 are not in contact with each other because of the potting material 61 and the grease 60.

In the next step (S104a), the position of the circuit board 32 is adjusted with the use of the lid part 31 and a jig before the potting material 61 hardens. More specifically, the position of the capacitor 35 inside the recess 30a is adjusted by deforming the potting material 61 and the grease 60. With this, the position of the through hole in the circuit board 32 is adjusted.

In the next step (S105a), the bus bar 120 is fixed to the inverter case 30 with the use of screws 100. The circuit board 32 is fixed to the inverter case 30 with the use of screws (not shown).

In the next step (S106a), the lid part 31 is fitted to the inverter case 30 from the second side in the axial direction (from above in FIG. 7). At this time, the terminal of the connector 36 is inserted into the through hole of the circuit board 32. Accordingly, the connector 36 is electrically connected with the circuit board 32. After that, the lid part 31 and the inverter case 30 are fixed to the compressor housing 11 with a plurality of screws. Thus, the inverter device 20 is assembled.

According to the present embodiment described above, the circuit board 32, the bus bar 120, and the capacitor 35 are electrically connected with each other before the circuit board 32, the bus bar 120, and the capacitor 35 are fixed to the inverter case 30, and the inverter device 20 includes the position-adjustment structure 110 that adjusts the position of the circuit board 32 relative to the inverter case 30, with the circuit board 32, the bus bar 120, and the capacitor 35 being united.

Thus, the position of the capacitor 35 inside the recess 30a is adjusted by deforming the potting material 61 and the grease 60. With this, the position of the through hole in the circuit board 32 can be correctly adjusted. Therefore, the terminal of the connector 36 can be inserted correctly into the through hole of the circuit board 32 when the lid part 31 is fitted to the inverter case 30. Favorable electrical connection between the connector 36 and the circuit board 32 can be achieved.

In the present embodiment, similarly to the second embodiment described above, the positions of the circuit board 32, the bus bar 120, and the capacitor 35 are adjusted relative to the inverter case 30 by the position-adjustment structure 110 configured by the recess 30a, the grease 60, and the potting material 61, without holders. Therefore, the inverter device 20 can be made small.

The capacitor 35 and the bus bar 120 in the present embodiment are mechanically connected with a plurality of terminals 35b, similarly to the described-above second embodiment. Therefore, stress application on the lead terminal 35a from the bus bar 120 or the capacitor 35 can be minimized.

Fourth Embodiment

While one example is described in the third embodiment in which the circuit board 32 is fixed to the inverter case 30, another example will be described in the fourth embodiment in which the circuit board 32 is fixed to the lid part 31.

Figure 10:
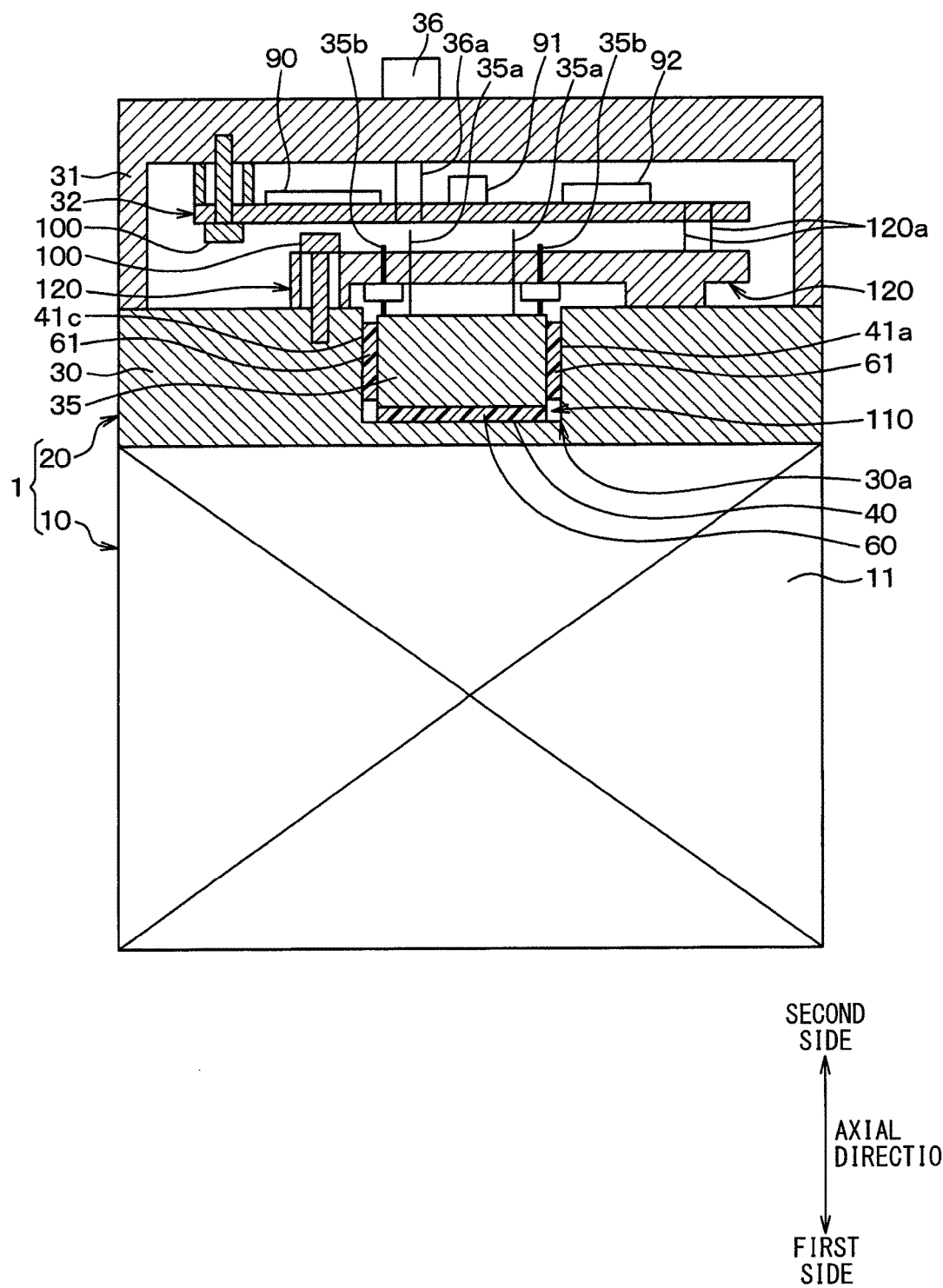
FIG. 10 is a schematic diagram illustrating main constituent elements of an electric compressor in a fourth embodiment of the present disclosure.

FIG. 10 illustrates main constituent components of the inverter device 20 of the present embodiment. Reference numerals in FIG. 10 that are the same as those of FIG. 5 denote the same elements.

A press-fit connection is applied in the present embodiment, and the terminal 120a of the bus bar 120 is inserted into a through hole of the circuit board 32 to connect the bus bar 120 to the circuit board 32. The circuit board 32 is fixed to the lid part 31 with screws 100. In the present embodiment, the coil 77 is not used.

Figure 11:
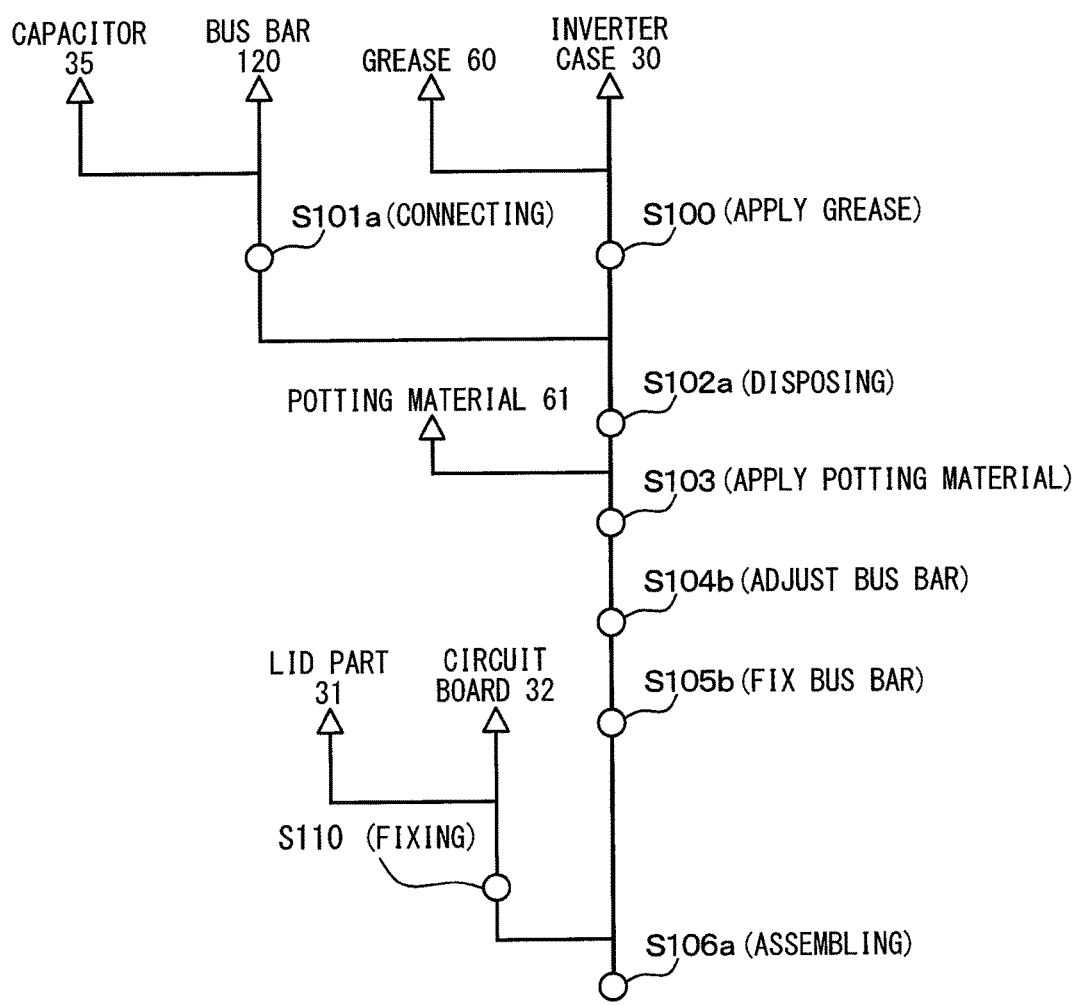
FIG. 11 is a flowchart illustrating a method for manufacturing the electric compressor of FIG. 10.

Next, a method for manufacturing the inverter device 20 of the present embodiment will be described with reference to FIG. 11. FIG. 11 is a flowchart illustrating the method for manufacturing the inverter device 20.

First, in the first step (S100), with the inverter case 30 disposed on the compressor housing 11, the grease 60 is applied, as a deformable first deformation member, on the bottom part 40 of the recess 30a of the inverter case 30 from the second side in the axial direction (from above in FIG. 10).

In the next step (S101a), the lead terminal 35a of the capacitor 35 is electrically connected with an electrical wire of the bus bar. Here, the capacitor 35 and the bus bar 120 are mechanically connected with a plurality of terminals 35b. This way, the distance between the capacitor 35 and the bus bar 120 is fixed with the plurality of terminals 35b. Thus, a sub assembly of the capacitor 35 and the bus bar 120 united in one piece (united electrical component) is obtained.

In the next step (S102a), the sub assembly is mounted to the inverter case 30 from the second side in the axial direction (from above in FIG. 10). More specifically, with the capacitor 35 set in the recess 30a, the capacitor 35 and the bus bar 120 are mounted to the inverter case 30. Thereby, the capacitor 35 and the bus bar 120 are supported by the inverter case 30.

In the next step (S103), the potting material 61 before the hardening is applied as a deformable second deformation member from the second side in the axial direction (from above in FIG. 10) to between the side faces 41a, 41b, 41c, and 41d that form the recess 30a of the inverter case 30 and the capacitor 35. The position-adjustment structure 110 is thus configured and the capacitor 35 and the inverter case 30 are not in contact with each other because of the potting material 61 and the grease 60.

In the next step (S104b), the position of the bus bar 120 is adjusted with the use of the lid part 31 and a jig before the potting material 61 hardens. More specifically, the position of the capacitor 35 inside the recess 30a is adjusted by deforming the potting material 61 and the grease 60. This way, the position of the terminal 120a of the bus bar 120 is adjusted.

In the next step (S105b), the bus bar 120 is fixed to the inverter case 30 with the use of screws 100.

In the next step (S110), the circuit board 32 is fixed to the lid part 31 with the use of screws 100.

In the next step (S106a), the lid part 31 is fitted to the inverter case 30 from the second side in the axial direction (from above in FIG. 10). At this time, the terminal 120a of the bus bar 120 is inserted into the through hole of the circuit board 32. Accordingly, the terminal 120a of the bus bar 120 is electrically connected with the circuit board 32. After that, the lid part 31 and the inverter case 30 are fixed to the compressor housing 11 with a plurality of screws. Thus, the inverter device 20 is assembled.

According to the present embodiment described above, the circuit board 32, the bus bar 120, and the capacitor 35 are electrically connected with each other before the circuit board 32, the bus bar 120, and the capacitor 35 are fixed to the inverter case 30, and the inverter device 20 includes the position-adjustment structure 110 that adjusts the position of the bus bar 120 relative to the inverter case 30, with the circuit board 32, the bus bar 120, and the capacitor 35 being united.

Thus, the position of the capacitor 35 inside the recess 30a is adjusted by deforming the potting material 61 and the grease 60. With this, the position of the terminal 120a of the bus bar 120 can be adjusted. Therefore, the terminal 120a of the bus bar 120 can be inserted correctly into the through hole of the circuit board 32 when the lid part 31 is fitted to the inverter case 30. Favorable electrical connection between the bus bar 120 and the circuit board 32 can be achieved.

In the present embodiment, similarly to the first embodiment described above, the positions of the bus bar 120 and the capacitor 35 are adjusted relative to the inverter case 30 by using the position-adjustment structure 110 configured by the recess 30a, the grease 60, and the potting material 61, without holders. Therefore, the inverter device 20 can be made small.

Other Embodiments

While one example is described in the first to third embodiments in which the terminal 36a of the connector 36 is electrically connected with the circuit board 32 with a press-fit connection, a connection of the terminal 36a and the circuit board 32 is not limited to the press-fit connection and the terminal 36a of the connector 36 may be electrically connected with the circuit board 32 by other connections.

Similarly, in the fourth embodiment, the terminal 120a and the bus bar 120 may be electrically connected with each other by other connections than the press-fit connection.

While one example is described in the first embodiment in which S101 is performed after S100, S100 may be performed after S101.

While one example is described in the second embodiment in which S101a, S101b, and S101c are performed after S100a, S100a may be performed after S101a, S101b, and S101c.

While one example is described in the third embodiment in which S101a and S101c are performed after S100, S100 may be performed after S101a and S101c.

While one example is described in the fourth embodiment in which S101a is performed after S100, S100 may be performed after S101a.

While one example is described in the second and third embodiments in which the terminals 35b are used as the fixing member for mechanically connecting the capacitor 35 and the bus bar 120 together, the fixing member is not limited to the terminals, and screws or bolts may be used.

While one example is described in the first to fourth embodiments in which the grease is disposed between the bottom part 40 of the recess 30a in the inverter case 30 and the capacitor 35, at least one of a potting material and a heat dissipation sheet may be provided instead. Alternatively, two or more of the grease, a potting material, and a heat dissipation sheet may be provided. The heat dissipation sheet is used for conducting heat generated from the capacitor 35 to the inverter case 30. The heat dissipation sheet is made of silicone or the like, for example.

Similarly, in the second embodiment above, one of a potting material and a heat dissipation sheet may be disposed between the bottom part 42 of the recess 30d in the inverter case 30 and the coil 77. Alternatively, two or more of the grease, a potting material, and a heat dissipation sheet may be provided.

While one example is described in the first to fourth embodiments in which the inverter case 30 that supports the circuit board 32 and the capacitor 35 are the mechanical component of the present disclosure, a seat that carries electrical components such as the circuit board 32 and capacitor 35 may be used as the mechanical component of the present disclosure.

While one example is described in the first to fourth embodiments in which the inverter case 30 as the mechanical component of the present disclosure is formed by one case, the inverter case 30 as the mechanical component of the present disclosure need not necessarily be one case and may be configured by two or more split cases.

While one example is described in the first to fourth embodiments in which the electrical device of the present disclosure is the inverter device 20, the electric device of the present disclosure need not necessarily be an inverter device and may be other electrical equipment than the inverter device 20.

While one example is described in the first embodiment in which the capacitor 35 and the circuit board 32 that configures the drive circuit 51 are the electrical components of the present disclosure, the electrical components are not limited to these and as long as they configure the drive circuit 51, the electrical components of the present disclosure may be other types of electrical components than the capacitor 35 such as coils, resistance elements, semiconductor elements, and the like.

While one example is described in the second, third, and fourth embodiments in which the capacitor 35, the bus bar 120, the coil 77, and the circuit board 32 that configure the drive circuit 51 are the electrical components of the present disclosure, the electrical components are not limited to these and as long as they configure the drive circuit 51, other components than the capacitor 35, the bus bar 120, the coil 77, and the circuit board 32 may be used as the electrical components of the present disclosure.

The present disclosure is not limited to the embodiments described above but can be changed as appropriate within the scope set forth in the claims. The various embodiments described above are not irrelevant to each other and can be combined as appropriate unless such combination is obviously impossible. It goes without saying that the elements that configure the various embodiments described above are not necessarily essential unless they are explicitly referred to as essential in particular or considered obviously essential in principle.

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

What is claimed is:

1. An electrical device comprising:
a drive circuit of an inverter including two or more electrical components, the two or more electrical components including at least two of a circuit board, a capacitor, a bus bar, and a coil;
an inverter case for the inverter that supports the two or more electrical components and is fixed to the two or more electrical components;
a position-adjustment structure that adjusts positions of the two or more electrical components relative to the inverter case with the two or more electrical components being united together, before the inverter case is fixed to the two or more electrical components, the position-adjustment structure including a recess in the inverter case and a deformation member, the deformation member including at least one of a potting material and grease interposed between one of the two or more electrical components and the inverter case and being capable of deforming; and an intermediate member that is united with the two or more electrical components and electrically connected with the two or more electrical components, the intermediate member including a bus bar;

wherein:

the position-adjustment structure adjusts positions of the two or more electrical components relative to the inverter case by deformation of the deformation member, with the one of the electrical components and the inverter case being in a non-contact state by using the deformation member;

the one of the two or more electrical components is electrically connected with the intermediate member by an electrical connection terminal;

the one of the electrical components and the intermediate member are mechanically connected together with a fixing member, to minimize stress application on the electrical connection terminal from the one of the electrical components or the intermediate member; and a distance between the intermediate member and the electrical connection terminal is made constant by the fixing member.

2. The electrical device according to claim 1, wherein at least one of the potting material fixes one of the two or more electrical components to the mechanical component, and the grease conducts heat from the one of the electrical components to the inverter case.

3. The electrical device according to claim 1, wherein the two or more electrical components include a first electrical component disposed inside the recess in the inverter case, and a second electrical component disposed so as to cover the first electrical component.

4. The electrical device according to claim 3, wherein the first electrical component is the capacitor or the coil, and the second electrical component is the circuit board.

5. A method for manufacturing the electrical device according to claim 3, the method comprising:

a first step of assembling a united electrical component that is the first electrical component and the second electrical component united together;

a second step of disposing a first deformation member as the deformation member on a bottom surface of the recess of the inverter case;

a third step of mounting the united electrical component on the inverter case such that the first electrical component is set inside the recess of the inverter case after the first step and the second step; and a fourth step of disposing a second deformation member as the deformation member between side faces that form the recess of the inverter case and the first electrical component after the third step so as to configure the position-adjustment structure by the first and second deformation members.

6. The electrical device according to claim 4, further comprising:

a second case that configures a housing that houses the capacitor and the circuit board, together with the inverter case; and a terminal disposed in the second case and electrically connected with the circuit board, wherein the position-adjustment structure adjusts position of the circuit board relative to the inverter case by adjusting a position of the capacitor inside the recess of the inverter case by deformation of the deformation member.

7. A method for manufacturing the electrical device according to claim 6, the method comprising:

a first step of assembling a united electrical component that is the capacitor and the circuit board united together;

a second step of disposing a first deformation member as the deformation member on a bottom surface of the recess in the inverter case;

a third step of disposing the united electrical component in the inverter case such that the capacitor is set inside the recess of the inverter case after the first step and the second step;

a fourth step of disposing a second deformation member as the deformation member between side faces that form the recess of the inverter case and the capacitor after the third step so as to configure the position-adjustment structure by the first and second deformation members;

a fifth step of deforming the first and second deformation members to adjust the position of the capacitor after the fourth step so as to adjust the position of the circuit board relative to the inverter case;

a sixth step of fixing the circuit board to the inverter case after the fifth step, and a seventh step of fitting the second case to the inverter case so as to configure a housing that houses the capacitor and the circuit board, and of connecting the circuit board to the terminal, after the sixth step.

8. The method according to claim 7, wherein in the second step, the first deformation member is disposed on the bottom surface of the recess of the inverter case in a predetermined direction, in the third step, the united electrical component is disposed on the inverter case in a direction same as the predetermined direction, in the fourth step, the second deformation member is disposed between the side faces that form the recess and the capacitor in a direction same as the predetermined direction, and in the seventh step, the second case is fitted to the inverter case in a direction that is the same as the predetermined direction.

9. The electrical device according to claim 1, wherein the inverter case houses the two or more electrical components, together with a second case, and the two or more electrical components include
    a first electrical component disposed in the recess of the inverter case,
    the bus bar disposed in the inverter case and including an electrical wire electrically connected with the first electrical component and a terminal electrically connected with the electrical wire, and
    a second electrical component supported on the second case and electrically connected with the terminal of the bus bar.

10. The electrical device according to claim 9, wherein the first electrical component is the capacitor or the coil, and the second electrical component is the circuit board.

11. A method for manufacturing the electrical device according to claim 9, the method comprising:

a first step of assembling a united electrical component that is the first electrical component and the bus bar united together;

a second step of disposing a first deformation member as the deformation member on a bottom surface of a recess in the inverter case;

a third step of disposing the united electrical component in the inverter case such that the first electrical component is set inside the recess of the inverter case after the first step and the second step;

a fourth step of disposing a second deformation member as the deformation member between side faces that form the recess of the inverter case and the first electrical component after the third step so as to configure the position-adjustment structure by the first and second deformation members;

a fifth step of deforming the first and second deformation members to adjust the position of the first electrical component after the fourth step so as to adjust the position of the bus bar relative to the inverter case;

a sixth step of fixing the bus bar to the inverter case after the fifth step; and a seventh step of fitting the second case to the inverter case so as to configure a housing that houses the first electrical component, the bus bar, and the second electrical component and connecting the terminal of the bus bar with the second electrical component after the sixth step.

12. The method according to claim 11, wherein in the second step, the first deformation member is disposed on the bottom surface of the recess of the inverter case in a predetermined direction, in the third step, the united electrical component is disposed on the inverter case in a direction that is the same as the predetermined direction, in the fourth step, the second deformation member is disposed between the side faces that form the recess and the first electrical component in a direction that is the same as the predetermined direction, and in the seventh step, the second case is fitted to the inverter case in a direction that is the same as the predetermined direction.

13. The method according to claim 5, wherein the first deformation member includes at least one or more of the potting material that fixes the first electrical component to the inverter case, and the grease that conducts heat from the first electrical component to the inverter case, and the second deformation member includes the potting material that fixes the first electrical component to the inverter case.

14. An electric compressor comprising:

the electrical device according to claim 1.

* * * * *